(12) United States Patent
Yao et al.

(10) Patent No.: US 10,752,990 B2
(45) Date of Patent: Aug. 25, 2020

(54) APPARATUS AND METHODS TO REMOVE RESIDUAL PRECURSOR INSIDE GAS LINES POST-DEPOSITION

(71) Applicant: Applied Materials, Inc., Santa Clara, CA (US)

(72) Inventors: Daping Yao, San Jose, CA (US); Kenric Choi, San Jose, CA (US); Xiaoxiong Yuan, San Jose, CA (US); Jiang Lu, Milpitas, CA (US); Can Xu, San Jose, CA (US); Paul F. Ma, Santa Clara, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/471,291

(22) Filed: Mar. 28, 2017

(65) Prior Publication Data

US 2017/0275754 A1 Sep. 28, 2017

Related U.S. Application Data

(60) Provisional application No. 62/313,976, filed on Mar. 28, 2016.

(51) Int. Cl.
*C23C 16/455* (2006.01)
*C23C 16/44* (2006.01)
(Continued)

(52) U.S. Cl.
CPC ........ *C23C 16/455* (2013.01); *C23C 16/4408* (2013.01); *C23C 16/4481* (2013.01); *F16K 31/12* (2013.01); *F16K 31/60* (2013.01); *C23C 16/18* (2013.01); *C23C 16/4402* (2013.01); *Y10T 137/3115* (2015.04)

(58) Field of Classification Search
CPC .............. C23C 16/455; C23C 16/4408; C23C 16/4481; C23C 16/18; C23C 16/4402; F16K 31/60; F16K 31/12; Y10T 137/3115; Y10T 137/313; Y10T 137/3133; Y10T 137/3084; Y10T 137/86372
See application file for complete search history.

(56) References Cited

U.S. PATENT DOCUMENTS 5,413,671 A 5/1995 Ketchum
5,517,538 A * 5/1996 Seidelberger ......... F16K 17/383
137/72

(Continued)

OTHER PUBLICATIONS

PCT International Search Report and Written Opinion in PCT/US2017/024482 dated Jun. 15, 2017, 14 pages.

(Continued)

*Primary Examiner* — Jessica Cahill
*Assistant Examiner* — Patrick C Williams
(74) *Attorney, Agent, or Firm* — Servilla Whitney LLC

(57) ABSTRACT

Apparatus and methods for supplying a gas to a processing chamber are described. The apparatus comprises an inlet line and an outlet line, each with two valves, in fluid communication an ampoule. A bypass line connects the inlet valve and outlet valve closest to the ampoule. The apparatus and methods of use allow a precursor residue to be removed from the delivery lines of a processing chamber.

16 Claims, 2 Drawing Sheets

(51) Int. Cl.
    *C23C 16/448*     (2006.01)
    *C23C 16/18*     (2006.01)
    *F16K 31/12*     (2006.01)
    *F16K 31/60*     (2006.01)

(56) References Cited

U.S. PATENT DOCUMENTS

| | | | |
|---|---|---|---|
| 6,033,479 A * | 3/2000 | Ikeda | B08B 9/032 |
| | | | 118/688 |
| 7,568,495 B2 | 8/2009 | Nakashima et al. | |
| 8,137,468 B2 | 3/2012 | Choi et al. | |
| 8,951,478 B2 | 2/2015 | Chu et al. | |
| 2003/0012709 A1 | 1/2003 | Xu et al. | |
| 2005/0249876 A1* | 11/2005 | Kawahara | C23C 16/45514 |
| | | | 427/255.34 |
| 2007/0235085 A1 | 10/2007 | Nakashima et al. | |
| 2009/0214778 A1* | 8/2009 | Sarigiannis | C23C 16/4481 |
| | | | 427/248.1 |
| 2010/0136230 A1 | 6/2010 | Moriya et al. | |
| 2012/0288625 A1 | 11/2012 | Furuya et al. | |
| 2013/0019960 A1 | 1/2013 | Choi | |

OTHER PUBLICATIONS

International Preliminary Report on Patentability, in PCT/US2017/024482, dated Oct. 11, 2018, 11 pages.

\* cited by examiner

APPARATUS AND METHODS TO REMOVE RESIDUAL PRECURSOR INSIDE GAS LINES POST-DEPOSITION

CROSS-REFERENCE TO RELATED APPLICATIONS

This application claims priority to U.S. Provisional Application No. 62/313,976, filed Mar. 28, 2016, the entire disclosure of which is hereby incorporated by reference herein.

FIELD

The disclosure pertains to a precursor ampoule and a gas delivery system for a processing chamber. More specifically, embodiments of the disclosure are directed to precursor ampoules and gas delivery systems with improved removal of residual precursor post-deposition.

BACKGROUND

Metal-organic (MO) precursor vapor is commonly used for the thermal deposition of metal films inside a well-controlled processing chamber. Metal-organic precursors are usually in liquid or solid form. Metal-organic vapor is usually generated thermally inside a closed vessel or ampoule. Molecules of the MO precursor are then delivered to a wafer surface inside the processing chamber through a delivery gasline. In order to prevent the vapor reverting back to its bulk form, the delivery gasline is usually thermally controlled to be well above the dew point of the particular MO precursor.

In order to have efficient delivery, an inert gas is usually used to carry the precursor vapor along the delivery line. The purpose of this carrier gas is mainly two-fold: (1) to increase the vapor pressure of the precursor due to agitation of gas flow into the vessel; and (2) to dilute the precursor inside the delivery line to raise the thermal decomposition temperature of the precursor.

After the deposition process reaches a predetermined thickness, an ampoule outlet pneumatic valve is closed; leaving the delivery line with a substantial amount of unused precursor vapor. This unused vapor should be quickly removed to preserve the well-controlled process performance. If not removed quickly, the residual precursor can accumulate to form various particulates which may contaminate the deposited film.

Most metal-organic chemical vapor deposition (MOCVD) processes of metal films are deposited using synthesized metastable chemicals as the precursors. Some of metal-organic precursors decompose readily at very low temperature. In order to achieve well-controlled process performance—such as precise thickness and low particle contamination—management of the residual precursor vapor in the delivery line post-deposition can be important. If the residual precursor is not removed promptly, it will be added to the subsequent deposition process. The residue can accumulate to form particles, which will be pushed onto wafer surface. Therefore, there is a need in the art for apparatus and methods to provide improved removal of residual precursor.

SUMMARY

One or more embodiments of the disclosure are directed to apparatus comprising an ampoule lid having an outside surface and an inside surface and a valve cluster connected to the outside surface of the ampoule lid. The valve cluster includes an inlet line and an outlet line. The inlet line is connected to the ampoule lid to allow fluid communication through the ampoule lid. The outlet line is connected to the ampoule lid to allow fluid communication through the ampoule lid. A first inlet valve is in fluid communication with the inlet line. A second inlet valve is in fluid communication with the inlet line and upstream of the first inlet valve. A first outlet valve is in fluid communication with the outlet line. A second outlet valve is in fluid communication with the outlet line and downstream of the first outlet valve. A bypass line is in fluid communication with the first inlet valve and the first outlet valve. A bypass valve is in fluid communication with the bypass line.

Additional embodiments of the disclosure are directed to ampoules comprising an ampoule base, an ampoule lid, an inlet line, an outlet line and a valve cluster. The ampoule base has a bottom with a sidewall extending from the bottom forming an interior of the ampoule. The ampoule lid has an outside surface and an inside surface. The ampoule lid is connected to a top end of the sidewall of the ampoule base enclosing the interior of the ampoule. The inlet line has an outside end and an inside end. The inlet line is in fluid communication with the interior of the ampoule. The outlet line has an outside end and an inside end. The outlet line is in fluid communication with the interior of the ampoule. A first inlet valve is in fluid communication with the inlet line. The first inlet valve is upstream of the ampoule lid and is a pneumatic valve. A second inlet valve is in fluid communication with the inlet line and upstream of and spaced apart from the first inlet valve. The second inlet valve is a manual valve. A first outlet valve is in fluid communication with the outlet line. The first outlet valve is downstream of the ampoule lid and is a pneumatic valve. A second outlet valve is in fluid communication with the outlet line and downstream of and spaced apart from the first outlet valve. The second outlet valve is a manual valve. A bypass line is in fluid communication with the first inlet valve and the first outlet valve. The bypass valve is in fluid communication with the bypass line.

Further embodiments of the disclosure are directed to ampoules comprising an ampoule base, an ampoule lid, an inlet line, an outlet line and a valve cluster. The ampoule base has a bottom with a sidewall extending from the bottom forming an interior of the ampoule. The ampoule lid has an outside surface and an inside surface and is connected to a top end of the sidewall of the ampoule base enclosing the interior of the ampoule. The inlet line has an outside end with an inlet disconnect and and inside end within the interior of the ampoule and spaced a distance from the inside surface of the ampoule lid. The inlet line is in fluid communication with an interior of the ampoule and has a sparger connected to and in fluid communication with the inside end. The outlet line has an outside end with an outlet disconnect and an inside end. The outlet line is in fluid communication with the interior of the ampoule. A first inlet valve is in fluid communication with the inlet line and is upstream of the ampoule lid. The first inlet valve is a pneumatic valve. A second inlet valve is in fluid communication with the inlet line and is upstream of and spaced apart from the first inlet valve. The second inlet valve is a manual valve. A first outlet valve is in fluid communication with the outlet line. The first outlet valve is downstream of the ampoule lid and is a pneumatic valve. A second outlet valve is in fluid communication with the outlet line and is downstream of and spaced apart from the first outlet valve. The second outlet valve is a manual valve. A bypass line is in fluid communication with the first inlet valve and the first outlet valve. A bypass valve is in fluid communication with the bypass line and is a pneumatic valve.

BRIEF DESCRIPTION OF THE DRAWINGS

So that the manner in which the exemplary embodiments of the present invention are attained and can be understood in detail, a more particular description of the disclosure, briefly summarized above, may be had by reference to the embodiments thereof which are illustrated in the appended drawings. It is to be appreciated that certain well known processes are not discussed herein in order to not obscure the invention.

DETAILED DESCRIPTION

One or more embodiments of the disclosure provide apparatus with valve configurations configured to allow complete removal of substantially all residual precursor vapors. Some embodiments of the disclosure allow the use of less expensive components. Some embodiments of the disclosure allow for easier manufacture of precursor ampoules by decreasing the tolerance on tubing length.

According to some embodiments, connecting a valve between inlet and outlet pneumatic valves bypasses the ampoule to its outlet tube rather than the conventional connection between two manual valves. Some embodiments allow for MOCVD deposition process carrier gas to be flowed through a bypass valve to an outlet pneumatic valve. The valve configuration can allow for complete remove the residual precursor vapor left over from a previous deposition by flowing of a purge gas through the tubes.

The outlet gas can be diverted to fore line directly or through the process chamber as long as there is a pressure drop. The higher the pressure drops the faster the removal rate of residual precursor from the lines. Processes that use metastable precursors, such as dicobalt hexacarbonyl tert-butylacetylene (CCTBA) for MOCVD Cobalt deposition may benefit from the claimed ampoule configuration. Given sufficient time, metastable precursors will decompose inside the gasline forming contaminants and particulates.

Figure 1:
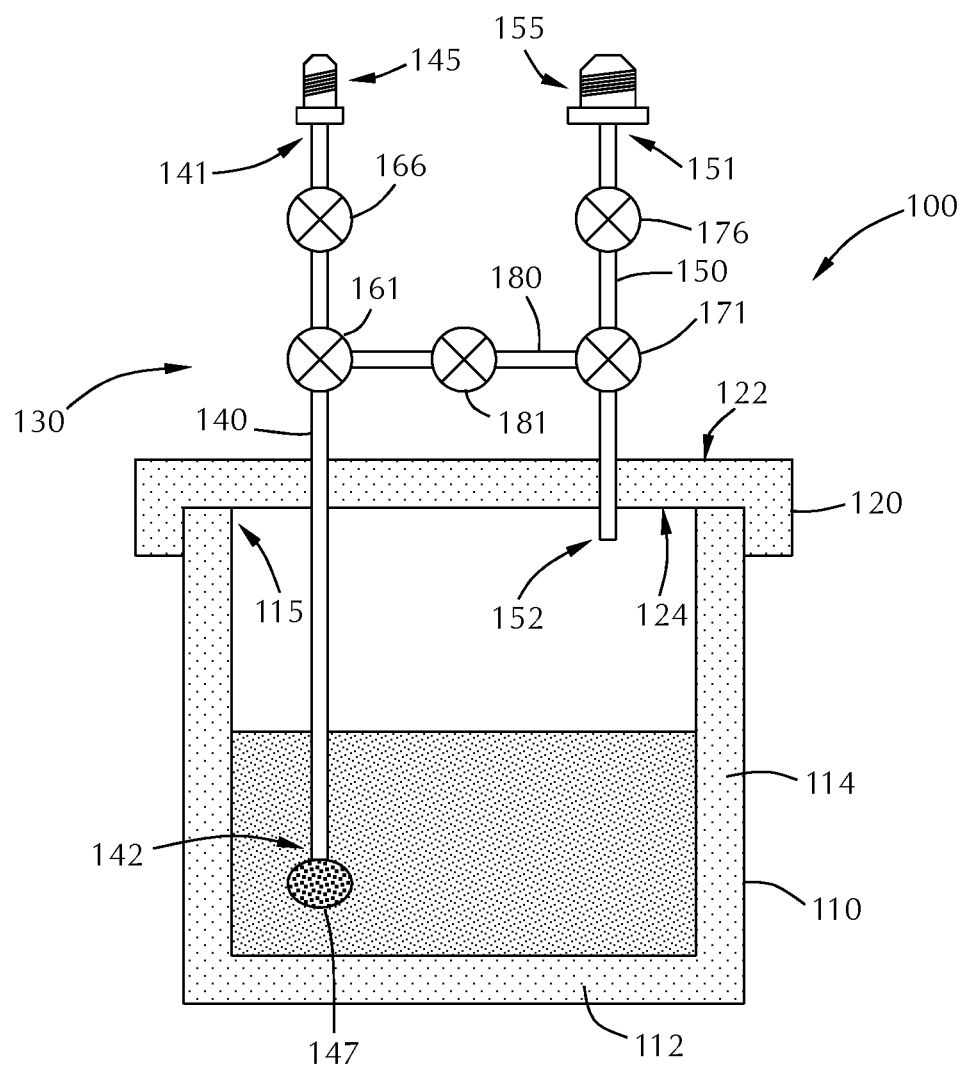
FIG. 1 shows a schematic of an ampoule in accordance with one or more embodiments of the disclosure.

FIG. 1 shows an ampoule 100 in accordance with one or more embodiments of the disclosure. While the ampoule 100 shown includes an ampoule base 110, an ampoule lid 120 and a valve cluster 130; those skilled in the art will understand that the disclosure is not limited to the configuration shown. Some embodiments of the disclosure are directed to an ampoule lid 120 with a valve cluster 130 attached that can be retrofit onto an existing ampoule base 110. Some embodiments are directed to a valve cluster 130 that can be retrofit onto an existing ampoule lid 120.

The ampoule base 110 has a bottom 112 with a sidewall 114 extending from the bottom 112. The bottom 112 and sidewall 114 can be integrally formed as a single component or can be multiple components joined together. In some embodiments, the ampoule base 110 is a single component formed into a cup-like shape so that the sidewall 114 and bottom 112 form an interior 116 of the ampoule 100.

The ampoule lid 120 is positioned at a top end 115 of the sidewall 114 of the ampoule base 110. The ampoule lid 120 can be attached to the ampoule base 110 by any suitable connections including, but not limited to, welding, friction fit, bolts between a flange (not shown) on each of the lid 120 and base 110.

The ampoule lid 120 has an outside surface 122 and an inside surface 124. When connected to the top end 115 of the sidewall 114, the ampoule lid 120 encloses the interior 116 of the ampoule 100.

An inlet line 140 is in fluid communication with the interior 116 of the ampoule 100. The inlet line 140 has an outside end 141 located on the outside of the ampoule 100. Stated differently, the outside end 141 is on the side of the ampoule lid 120 with the outside surface 122. The inlet line 140 has an inside end 142 located within the interior 116 of the ampoule 100. In an embodiment in which there is no ampoule base 110, the inside end 142 of the inlet line 140 is on the side of the ampoule lid 120 with the inside surface 124.

The inside end 142 of the inlet line 140 can be flush with the inside surface 124 of the ampoule lid 120. In the embodiment shown in FIG. 1, the inside end 142 of the inlet line 140 extends a distance from the inside surface 124 of the ampoule lid 120. In some embodiments, the distance that the inlet line 140 extends from the inside surface 124 of the ampoule lid 120 is sufficient to bring the inside end 142 of the inlet line 140 to a distance in the range of about 10 mm to about 100 mm from the bottom 112 of the ampoule base 110.

In some embodiments, an inlet disconnect 145 is located at the outside end 141 of the inlet line 140. The inlet disconnect 145 can be any component that allows the inlet line 140 to be connected to and disconnected from. For example, the inlet disconnect 145 can be coupling with screw threads to allow the disconnect 145 to be screwed into a receiving nut (not shown). The inlet disconnect 145 is in fluid communication with the inlet line 140 so that a fluid can flow through the outside end 141 of the inlet line 140.

In some embodiments, the inside end 142 of the inlet line 140 has a component to redirect or diffuse the flow of gas through the inlet line 140. In some embodiments, a sparger 147 is positioned on the inside end 142 of the inlet line 140. The sparger 147 is in fluid communication with the inlet line 140 to allow a gas flowing through the inlet line 140 to pass through the sparger 147 to bubble through the precursor 118.

In some embodiments, the inside end 142 of the inlet line 140 is above the level of precursor 118. In one or more embodiments, the inside end 142 of the inlet line 140 and the inside end 152 of the outlet line 150 do not contact the precursor 118. In an embodiment of this sort, the precursor vapor in the headspace above the precursor 118 is carried through the outlet line 150 to the processing chamber.

An outlet line 150 is in fluid communication with the interior 116 of the ampoule 100. The outlet line 150 has an outside end 151 located on the outside of the ampoule 100. In an embodiment in which there is no ampoule base 110, the outside end 151 is located on the outside surface 122 side of the ampoule lid 120. The outlet line 150 has an inside end 152 which, in the embodiment shown in FIG. 1, can be located within the interior 116 of the ampoule 100. In an embodiment in which there is no ampoule base 110, the inside end 152 of the outlet line is on the inside surface 124 side of the ampoule lid 120.

The inside end 152 of the outlet line 150 can be flush with the inside surface 124 of the ampoule lid 120. In the embodiment shown in FIG. 1, the inside end 152 extends a distance from the inside surface 124. Stated differently, the outlet line 150 extends a distance from the inside surface 124 of the ampoule lid 120 so that the inside end 152 is a distance within the interior 116 of the ampoule 100. The distance that the inside end 152 extends from the inside surface 124 can vary in the range of about flush with the inside surface 124 to 50 mm. In some embodiments, the inside end 152 extends from the inside surface 124 by an amount less than or equal to about 40 mm, 30 mm, 20 mm or 10 mm. In some embodiments, the inside end 152 of the outlet line 150 is at least about 1 mm from the inside surface 124 so that the inside end 152 is not flush with the inside surface 124. In some embodiments, the inside end 152 extends from the inside surface 124 by an amount in the range of about 1 mm to about 40 mm, or about 2 mm to about 35 mm, or about 3 mm to about 30 mm, or about 4 mm to about 25 mm, or about 5 mm to about 20 mm.

In an embodiment in which the precursor is a liquid, the inside end 152 of the inlet line 150 does not extend far enough from the inside surface 124 of the ampoule lid 120 to contact the liquid. In one or more embodiments, the inside end 152 of the outlet line 150 sticks out from the inside surface 124 of the ampoule lid 120 a small amount toward the precursor 118. The edge of the inside end 152 may reduce condensed liquid or splashed liquid from entering the outlet line 150. The inside end 152 of the outlet line 150 does not extend into the interior 116 far enough to reduce the amount of precursor being delivered.

In some embodiments, the outlet line 150 includes an outlet disconnect 155 at an outside end 151. The outlet disconnect 155 is in fluid communication with the outlet line 150 so that a fluid flowing through the outlet line 150 can pass through the outlet disconnect 155. The outlet disconnect 155 can be any component that allows the outlet line 150 to be connected to and disconnected from. For example, the outlet disconnect 155 can be a coupling with screw threads to allow the outlet disconnect 155 to be screwed into a receiving nut (not shown). The outlet disconnect 155 can be the same style or size as the inlet disconnect 145. In some embodiments, the inlet disconnect 145 and the outlet disconnect 155 are different sizes so that the inlet line 140 and outline line 150 can be easily distinguished.

Some embodiments include a splash guard (not shown). The splash guard can be connected to the inside surface 124 of the ampoule lid 120 or to the sidewall 114 of the ampoule base 110. The inside end 152 of the outlet tube 150 can extend into the headspace above the precursor 118 by an amount to serve as a splash guard. The use of both a splash guard (not shown) and the inside end 152 of the outlet tube 150 extending into the headspace above the precursor 118 has been found to reduce precursor entrapment and liquid flush.

The valve cluster 130 includes a first inlet valve 161 in fluid communication with the inlet line 140. The first inlet valve 161 is located upstream of the ampoule lid 120 adjacent to the outside surface 122. The first inlet valve 161 can be placed as close to the outside surface 122 of the ampoule lid 120 as possible or can be spaced a distance from the outside surface 122.

The first inlet valve 161 can be any suitable valve that allows fluid communication between the upstream side of the valve and the downstream side of the valve. The first inlet valve 161 of some embodiments is a three-way valve that allows a flow of gas to pass from the upstream side of the valve to one or two downstream legs. For example, the first inlet valve 161 in the embodiment shown in FIG. 1 is a three-way valve that allows the flow of gas to pass through the valve 161 to flow into the interior 116 of the ampoule 100 or to flow into the bypass line 180.

The first inlet valve 161 can be a manual valve which is operated by hand or can be a pneumatic valve that can be controlled electronically. In some embodiments, the first inlet valve 161 is a pneumatic valve.

A second inlet valve 166 in fluid communication with the inlet line 140. The second inlet valve 166 is located upstream of the first inlet valve 161. The second inlet valve 166 is spaced from the first inlet valve 161 along a length of the inlet line 140. The space between the first inlet valve 161 and the second inlet valve 166 can be any space and is not limited to short distances.

The second inlet valve 166 can be a manual valve which is operated by hand or a pneumatic valve which can be electronically controlled. In some embodiments, the second inlet valve 166 is a manual valve and the first inlet valve 161 is a pneumatic valve.

A first outlet valve 171 is in fluid communication with the outlet line 150. The first outlet valve 171 is located downstream of the ampoule lid 120. The first outlet valve 171 is located upstream of the ampoule lid 120 adjacent to the outside surface 122 of the ampoule lid 120. The first outlet valve 171 can be placed as close to the outside surface 122 of the ampoule lid 120 as possible or can be spaced a distance from the outside surface 122.

The first outlet valve 171 can be any suitable valve that allows fluid communication between the upstream side of the valve (i.e., nearer the ampoule) and the downstream side (i.e., further from the ampoule) of the valve 171. The first outlet valve 171 of some embodiments is a three-way valve that allows a flow of fluid to pass from the upstream side of the valve from one or two legs to the downstream side of the valve. For example, the first outlet valve 171 in the embodiment shown in FIG. 1 is a three-way valve that allows the flow of fluid to pass through the valve 171 from the interior 116 of the ampoule 100 or from the bypass line 180, or from both.

The first outlet valve 171 can be a manual valve which is operated by hand or can be a pneumatic valve that can be controlled electronically. In some embodiments, the first outlet valve 171 is a pneumatic valve.

A second outlet valve 176 in fluid communication with the outlet line 150. The second outlet valve 176 is located downstream of the first outlet valve 171. The second outlet valve 176 is spaced from the first outlet valve 171 along a length of the outlet line 150. The space between the first outlet valve 171 and the second outlet valve 176 can be any space and is not limited to short distances.

The second outlet valve 176 can be a manual valve which is operated by hand or a pneumatic valve which can be electronically controlled. In some embodiments, the second outlet valve 176 is a manual valve and the first outlet valve 171 is a pneumatic valve.

A bypass line 180 is in fluid communication with the first inlet valve 161 and the first outlet valve 171. In the flow path, the first inlet valve 161 can be a three-way valve that allows the flow of fluid to pass through the valve 161 from the upstream side (i.e., further from the interior 116) to the interior 116 or to the bypass line 180, or a combination of both. The fluid flowing through the bypass line 180 can pass through the first outlet valve 171 which is a three-way valve that allows fluid from the bypass line 180, the interior 116 of the ampoule 100, or both to pass through.

In some embodiments, the bypass line 180 includes a bypass valve 181 in fluid communication with the bypass line 180. The bypass valve 181 can be a manual valve which is operated by hand or a pneumatic valve which can be electronically controlled. In some embodiments, the bypass valve 181 is a pneumatic valve. In one or more embodiments, the first inlet valve 161, the first outlet valve 171 and the bypass valve 181 are pneumatic valves.

In use, a carrier gas (e.g., Ar) flows into the inlet line 140 through the outside end 141. The gas passes through the second inlet valve 166 from an upstream side of the valve to the downstream side of the valve. The gas passes through the first inlet valve 161 from an upstream side of the valve to the downstream side of the valve. The gas then passes into the interior 116 of the ampoule through sparger 147. In the interior 116, the gas disturbs the precursor 118 and carries precursor molecules to inside end 152 of the outlet line 150. The gas including precursor flows through the first outlet valve 171 and the second outlet valve 176 toward, for example, a processing chamber. Once the process has been completed, the first inlet valve 161 and first outlet valve 171 can be closed, or diverted to allow flow through the bypass line 180. The bypass valve 181 can be opened allowing the carrier gas, or purge gas, to flow through the second inlet valve 166 and the first inlet valve 161 before passing through the bypass valve 181 and bypass line 180. The purge gas then flows through the first outlet valve 171 and the second outlet valve 176 of the outlet line 150 removing all residue of the precursor that may remain in the outlet line 150.

Figure 2:
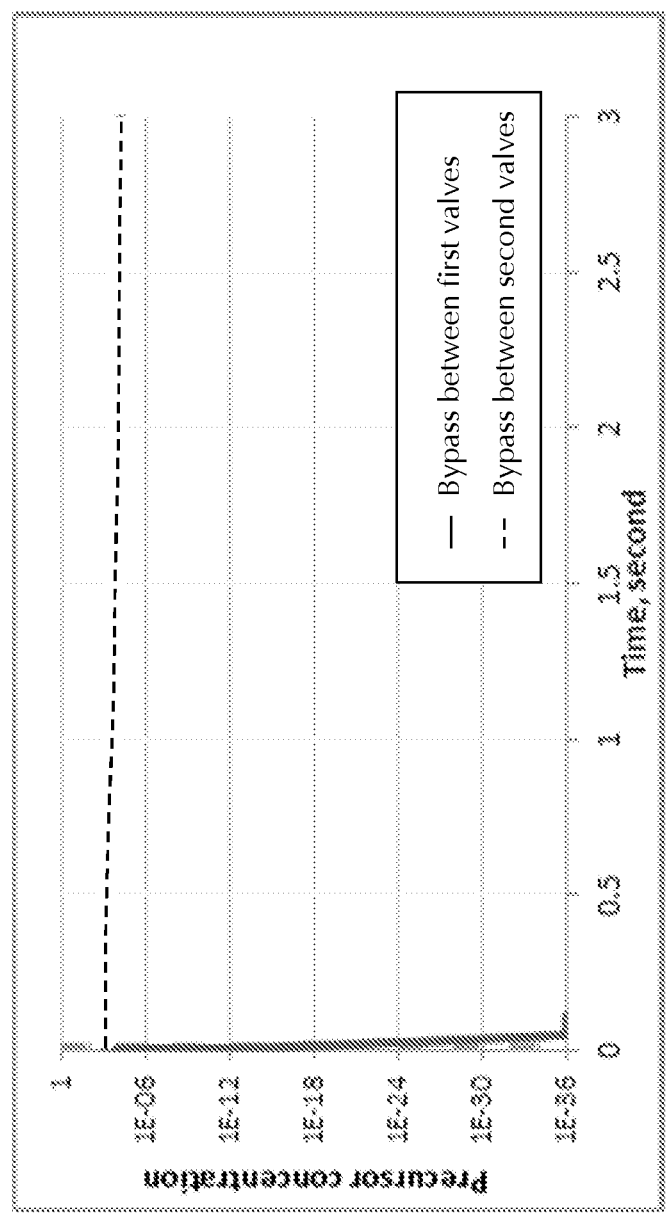
FIG. 2 shows a graph of precursor concentration in the delivery path after closing the valves as a function of time.

The precursor molar concentration at the point after the first outlet valve 171 was calculated for two configurations. The first configuration is similar to that shown in FIG. 1 in which the bypass valve 180 is between the first inlet valve 161 and the second inlet valve 171. The second configuration matches a conventional component in which the bypass line is between the second inlet valve 166 and the second outlet valve 176. FIG. 2 shows a graph of the precursor concentration between the first outlet valve 171 and the second outlet valve 176 after closing the valves as a function of time. The outlet line 140 is calculated as being connected to a low pressure region at 1 Torr. It can be seen that the concentration of precursor between the first outlet valve 171 and the second outlet valve 176 drops significantly within the first 0.1 seconds of purge for the claimed configuration, whereas the precursor concentration between the outlet valves remains substantially the same for more than 3 seconds.

When the bypass line 180 and bypass valve 181 are connected between the first inlet valve 161 and the first outlet valve 171, the residual precursor inside the precursor delivery path from the first outlet valve 171 to the second outlet valve 176 can be purged away quickly. It has been found that fast removal of the residual precursor from the delivery line reduces the particle formation.

Some embodiments allow for fast transitions between deposition conditions and other treatments due to the residual being rapidly removed from the residual line. Gas flow through the first outlet line 171 prevents precursor stagnating on the valve seal, extending the life of the valve seal.

While the foregoing is directed to embodiments of the present invention, other and further embodiments of the disclosure may be devised without departing from the basic scope thereof, and the scope thereof is determined by the claims that follow.

What is claimed is:

1. An apparatus comprising:
    an ampoule lid having an outside surface and an inside surface; and
    a valve cluster connected to the outside surface of the ampoule lid, the valve cluster including:
        an inlet line connected to the ampoule lid to allow fluid communication through the ampoule lid;
        an outlet line connected to the ampoule lid to allow fluid communication through the ampoule lid;
        a first inlet valve adjacent to the outside surface and in fluid communication with the inlet line and connected to a bypass line, the first inlet valve being a three-way valve with a first upstream leg connected to the inlet line, a first downstream leg connected to the inlet line and a second downstream leg connected to the bypass line, the first inlet valve configured to operate in first, second, and third inlet positions, the first inlet position allowing a flow of fluid from the first upstream leg exclusively to the first downstream leg, the second inlet position allowing a flow of fluid from the first upstream leg exclusively to the second downstream leg, and the third inlet position allowing a flow of fluid from the first upstream leg to both the first downstream leg and the second downstream leg simultaneously;
        a second inlet valve in fluid communication with the inlet line and upstream of the first inlet valve;
        a first outlet valve adjacent to the outside surface and in fluid communication with the outlet line and connected to the bypass line, the first outlet valve being a three-way valve with a second upstream leg connected to the outlet line, a third upstream leg connected to the bypass line and a third downstream leg connected to the outlet line, the first outlet valve configured to operate in first, second, and third outlet positions, the first outlet position allowing a flow of fluid to pass exclusively from the second upstream leg to the third downstream leg, the second outlet position allowing a flow of fluid to pass exclusively from the third upstream leg to the third downstream leg, and the third outlet position allowing a flow of fluid to pass from both the second upstream leg and the third upstream leg simultaneously to the third downstream leg;
        a second outlet valve in fluid communication with the outlet line and downstream of the first outlet valve; and
        a bypass valve in fluid communication with the bypass line.

2. The apparatus of claim 1, wherein the first inlet valve is a pneumatic valve.

3. The apparatus of claim 1, wherein the first outlet valve is a pneumatic valve.

4. The apparatus of claim 1, wherein the bypass valve is a pneumatic valve.

5. The apparatus of claim 1, wherein the second inlet valve is a manual valve.

6. The apparatus of claim 1, wherein the second outlet valve is a manual valve.

7. The apparatus of claim 1, further comprising an inlet disconnect in fluid communication with the inlet line and positioned upstream of the second inlet valve at an outside end of the inlet line.

8. The apparatus of claim 1, further comprising an outlet disconnect in fluid communication with the outlet line and positioned downstream of the second outlet valve at an outside end of the outlet line.

9. The apparatus of claim 1, wherein the inlet line extends through the ampoule lid a distance from the inside surface of the ampoule lid.

10. The apparatus of claim 9, further comprising a sparger on an end of the inlet line on the inside surface of the ampoule lid.

11. An ampoule comprising:
an ampoule base having a bottom with a sidewall extending from the bottom forming an interior of the ampoule;
an ampoule lid having an outside surface and an inside surface, the ampoule lid connected to a top end of the sidewall of the ampoule base enclosing the interior of the ampoule;
an inlet line having an outside end and an inside end, the inlet line in fluid communication with the interior of the ampoule;
an outlet line having an outside end and an inside end, the outlet line in fluid communication with the interior of the ampoule;
a first inlet valve adjacent to the outside surface and in fluid communication with the inlet line and connected to a bypass line, the first inlet valve upstream of the ampoule lid, the first inlet valve being a three-way pneumatic valve with a first upstream leg connected to the inlet line, a first downstream leg connected to the inlet line and a second downstream leg connected to the bypass line, the first inlet valve configured to operate in first, second, and third inlet positions, the first inlet position allowing a flow of fluid from the first upstream leg exclusively to the first downstream leg, the second inlet position allowing a flow of fluid from the first upstream leg exclusively to the second downstream leg, and the third inlet position allowing a flow of fluid from the first upstream leg to both the first downstream leg and the second downstream leg simultaneously; a second inlet valve in fluid communication with the inlet line and upstream of and spaced from the first inlet valve, the second inlet valve being a manual valve; a first outlet valve adjacent to the outside surface and in fluid communication with the outlet line and connected to the bypass line, the first outlet valve downstream of the ampoule lid, the first outlet valve being a three-way pneumatic valve with a second upstream leg connected to the outlet line, a third upstream leg connected to the bypass line and a third downstream leg connected to the outlet line, the first outlet valve configured to operate in first, second, and third outlet positions, the first outlet position allowing a flow of fluid to pass exclusively from the second upstream leg to the third downstream leg, the second outlet position allowing a flow of fluid to pass exclusively from the third upstream leg to the third downstream leg, and the third outlet position allowing a flow of fluid to pass from both the second upstream leg and the third upstream leg simultaneously to the third downstream leg;
a second outlet valve in fluid communication with the outlet line and downstream of and spaced from the first outlet valve, the second outlet valve being a manual valve; and
a bypass valve in fluid communication with the bypass line.

12. The ampoule of claim 11, further comprising an inlet disconnect at the outside end of the inlet line, the inlet disconnect in fluid communication with the inlet line.

13. The ampoule of claim 11, further comprising an outlet disconnect at the outside end of the outlet line, the outlet disconnect in fluid communication with the outlet line.

14. The ampoule of claim 11, wherein the inlet line extends through the ampoule lid a distance from the inside surface of the ampoule lid.

15. The ampoule of claim 14, further comprising a sparger on an end of the inlet line on the inside surface of the ampoule lid.

16. An ampoule comprising:
an ampoule base having a bottom with a sidewall extending from the bottom forming an interior of the ampoule;
an ampoule lid having an outside surface and an inside surface, the ampoule lid connected to a top end of the sidewall of the ampoule base enclosing the interior of the ampoule;
an inlet line having an outside end with an inlet disconnect and an inside end within the interior of the ampoule spaced a distance from the inside surface of the ampoule lid, the inlet line in fluid communication with the interior of the ampoule, the inlet line having a sparger connected to and in fluid communication with the inside end;
an outlet line having an outside end with an outlet disconnect and an inside end, the outlet line in fluid communication with the interior of the ampoule;
a first inlet valve adjacent to the outside surface in fluid communication with the inlet line and a bypass line, the first inlet valve upstream of the ampoule lid, the first inlet valve being a three-way pneumatic valve with a first upstream leg connected to the inlet line, a first downstream leg connected to the inlet line and a second downstream leg connected to the bypass line, the first inlet valve configured to operate in first, second, and third inlet positions, the first inlet position allowing a flow of fluid from the first upstream leg exclusively to the first downstream leg, the second inlet position allowing a flow of fluid from the first upstream leg exclusively to the second downstream leg, and the third inlet position allowing a flow of fluid from the first upstream leg to both the first downstream leg and the second downstream leg simultaneously; a second inlet valve in fluid communication with the inlet line and upstream of and spaced from the first inlet valve, the second inlet valve being a manual valve; a first outlet valve adjacent to the outside surface and in fluid communication with the outlet line and the bypass line, the first outlet valve downstream of the ampoule lid, the first outlet valve being a three-way pneumatic valve with a second upstream leg connected to the outlet line, a third upstream leg connected to the bypass line and a third downstream leg connected to the outlet line, the first outlet valve configured to operate in first, second, and third outlet positions, the first outlet position allowing a flow of fluid to pass exclusively from the second upstream leg to the third downstream leg, the second outlet position allowing a flow of fluid to pass exclusively from the third upstream leg to the third downstream leg, and the third outlet position allowing a flow of fluid to pass from both the second upstream leg and the third upstream leg simultaneously to the third downstream leg; a second outlet valve in fluid communication with the outlet line and downstream of and spaced from the first outlet valve, the second outlet valve being a manual valve; and a bypass valve in fluid communication with the bypass line, the bypass valve being a pneumatic valve.

* * * * *